United States Patent
Watanabe et al.

(10) Patent No.: US 9,524,366 B1
(45) Date of Patent: Dec. 20, 2016

(54) ANNOTATIONS TO IDENTIFY OBJECTS IN DESIGN GENERATED BY HIGH LEVEL SYNTHESIS (HLS)

(71) Applicant: Cadence Design Systems, Inc., San Jose, CA (US)

(72) Inventors: Yosinori Watanabe, Lafayette, CA (US); Felice Balarin, Berkeley, CA (US); Abhinav Tallapally, Milpitas, CA (US); Walter Johan Ghijsen, San Jose, CA (US); Michael J. Meyer, Palo Alto, CA (US); Sherry Solden, Palo Alto, CA (US); David Van Campenhout, San Jose, CA (US); Viorica Simion, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/731,300

(22) Filed: Jun. 4, 2015

(51) Int. Cl.
G06F 17/50 (2006.01)
G06F 17/24 (2006.01)
G06F 17/27 (2006.01)

(52) U.S. Cl.
CPC ......... *G06F 17/5081* (2013.01); *G06F 17/241* (2013.01); *G06F 17/2705* (2013.01)

(58) Field of Classification Search
CPC .......................... G06F 17/5045; G06F 17/505
USPC ........................................ 716/101, 106, 107
See application file for complete search history.

(56) References Cited

U.S. PATENT DOCUMENTS

| | | | | |
|---|---|---|---|---|
| 5,493,508 A | * | 2/1996 | Dangelo et al. ..... | G06F 17/5045 716/103 |
| 5,956,256 A | * | 9/1999 | Rezek et al. ........ | G06F 17/5031 716/108 |
| 5,980,092 A | * | 11/1999 | Merryman et al. . | G06F 17/5045 716/108 |
| 6,226,220 B1 | * | 5/2001 | Takeda .................. | G11C 11/419 365/230.06 |
| 6,484,296 B1 | * | 11/2002 | McBride et al. ... | G06F 17/5022 716/107 |
| 6,505,339 B1 | * | 1/2003 | Miller et al. ........ | G06F 17/5045 716/104 |
| 8,359,583 B2 | * | 1/2013 | Chou et al. ......... | G06F 11/3612 716/104 |

(Continued)

*Primary Examiner* — Sun Lin
(74) *Attorney, Agent, or Firm* — Andrews Kurth Kenyon LLP

(57) ABSTRACT

Methods and systems provide creating and reporting of path annotations and renaming a state node using the path annotations for high level synthesis (HLS). In an embodiment, a method to annotate a state node includes identifying labels and pragmas specified in a high-level language input model for wait statements and function calls, and can also accommodate loops. In an embodiment, a method to display and/or report annotation information for a given state node includes displaying a state node name, an associated path annotation, and/or an associated hierarchical path. In an embodiment, a method to rename a state node based on a user-specified name includes using annotation information to locate a target state node and associating the target state node with the user-specified name or an automatically-created name based on the user-specified name. In an embodiment, a name specified for a state node can persist through successive runs of an HLS tool.

20 Claims, 8 Drawing Sheets

1100

BEHAVIOR: MY_DESIGN_THREAD_MAIN

| STATE NODE | LOGICAL NAME | PATH ANNOTATION | HIERARCHICAL PATH |
|---|---|---|---|
| 1 | Present_mode_complete | F_control<br>F_exe_cost_0<br>W_modeset | control_ln553<br>exe_cost_ln1403<br>Wait_ln3904 |
| 2 | ChrInit_mode_complete | unr0<br>W_modeset | for_ln1604 (iteration 0)<br>exe_cost_ln1620<br>Wait_ln3904_0_unr0 |

(56) References Cited

U.S. PATENT DOCUMENTS

| | | | | |
|---|---|---|---|---|
| 8,683,419 B1* | 3/2014 | Hines et al. | ......... | G06F 17/505 |
| | | | | 716/109 |
| 8,966,416 B2* | 2/2015 | Klimasauskas | ....... | G06F 17/505 |
| | | | | 716/104 |
| 9,003,339 B2* | 4/2015 | Jensen et al. | ......... | G06F 17/505 |
| | | | | 716/104 |

* cited by examiner

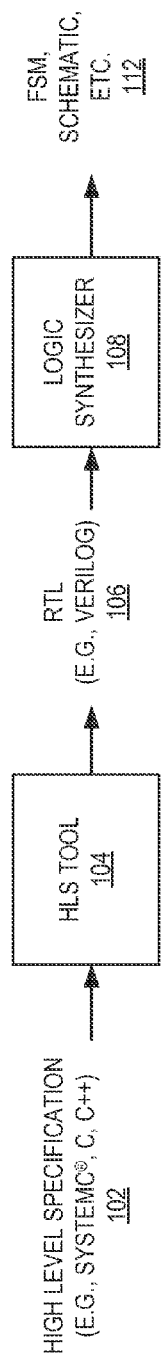
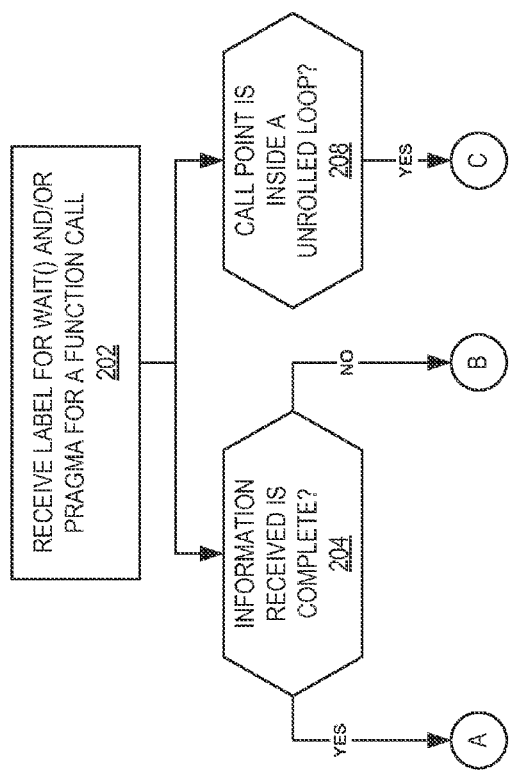

```
302 ⤳   void my_design::thread_main() {
                ...
                #pragma ctos annotate F_control
                control();
                ...
        }

304 ⤳   void my_design::control() {
                ...
                #pragma ctos annotate F_exe_cost_0
                exe_cost();
                ...
        }

306 ⤳   void my_design::exe_cost() {
                ...
                W_modeset: wait();
                ...
        }
```

300

400

```
502 ⤳   void my_design::thread_main() {
            ...
            #pragma ctos annotate F_control
            control();
            ...
        }
```

500

```
504 ⤳   void my_design::control() {
            ...
            //no pragma is specified
            exe_cost();
            ...
        }
```

```
506 ⤳   void my_design::exe_cost() {
            ...
            W_modeset: wait();
            ...
        }
```

600

```
void my_design::thread_main() {
    ...
    for(uint i=0; i<8; i++){
        ...
702→    #pragma ctos annotate F_control
        control();
    }
    ...
}

704→ void my_design::control() {
    ...
    //no pragma is specified
    exe_cost();
    ...
}

706→ void my_design::exe_cost() {
    ...
    W_modeset: wait();
    ...
}
```

BEHAVIOR: MY_DESIGN_THREAD_MAIN

| STATE NODE | STATE NAME | PATH ANNOTATION | HIERARCHICAL PATH |
|---|---|---|---|
| 1 | Wait_In3904 | F_control<br>F_exe_cost_0<br>W_modeset | control_In553<br>exe_cost_In1403<br>Wait_In3904 |
| 2 | Wait_In3904_0unr0 | Unr0<br><br>W_modeset | for_In1604 (iteration 0)<br>exe_cost_In1620<br>Wait_In3904_0_unr0 |

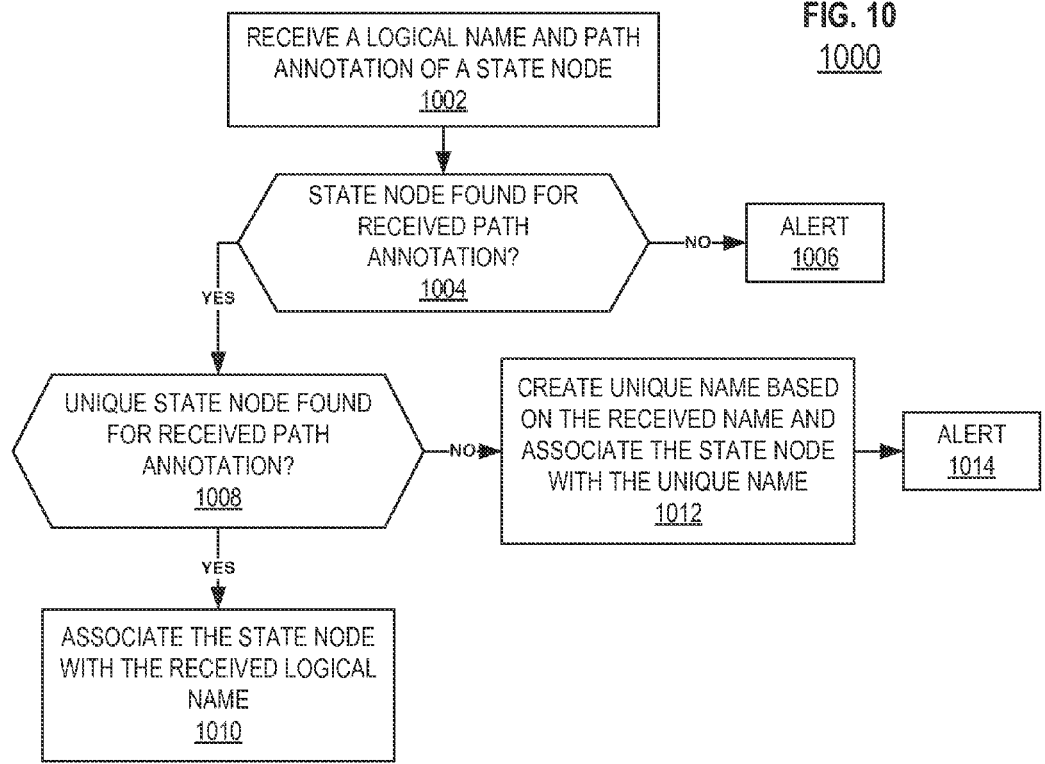

1200

1300

1400

1500

ANNOTATIONS TO IDENTIFY OBJECTS IN DESIGN GENERATED BY HIGH LEVEL SYNTHESIS (HLS)

FIELD OF THE DISCLOSURE

The present disclosure relates to a method and system for electronic design and verification. More specifically, it relates to a method and system for specifying an annotation and retaining the annotation over successive runs in a translation from a high level synthesis (HLS) design to digital hardware.

BACKGROUND

In electronic design and verification, raising design abstraction levels generally increases productivity by speeding up the design and verification process. Electronic design involves creation and verification of hardware. However, a design process is delayed by manually writing register transfer level (RTL) descriptions having the same functions as a high level specification model written in a high-level language such as C, C++, or SystemC®. Thus, hardware design would be improved and accelerated by automatic translating high level specification models to RTL models. One type of translator is the C-to-Silicon (CtoS) compiler. The CtoS compiler reads a high-level language description of hardware architecture and generates a Verilog RTL micro-architecture using high-level constraints unique to a target product's requirements and process library. The constraints may be modified based on visual feedback from a graphical design environment and incremental database. However, some functions related to analysis of CtoS-generated RTL models require analysis of the high-level language source code, which may be challenging or tedious for a user. Thus, there exists a need in the art to make features of a CtoS compiler more user-friendly.

BRIEF DESCRIPTION OF THE DRAWINGS

FIG. 1 is a simplified block diagram of a high level synthesis (HLS) system.

FIG. 2 is a flowchart of a method to create a path annotation according to an embodiment.

FIG. 9 is a simplified report of annotation and state node information according to an embodiment.

FIG. 10 is a flowchart of a method to name a state node according to an embodiment.

FIG. 11 is a simplified table of annotation information including a user-specified name for a state node according to an embodiment.

DETAILED DESCRIPTION

Figures 3, 4:
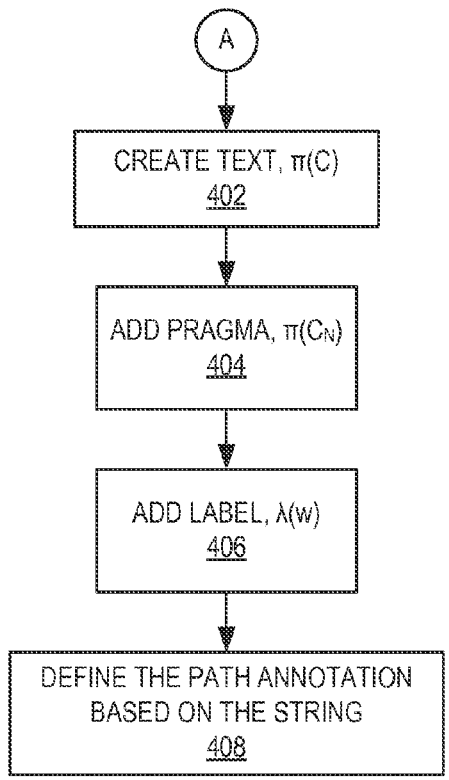
FIG. 3 shows pseudo-code provided to a CtoS compiler according to an embodiment.
FIG. 4 is a flowchart of a method to create a path annotation according to an embodiment.

FIG. 1 is a simplified block diagram of a high level synthesis (HLS) system 100. The system 100 may include an HLS tool 104 and a logic synthesizer 108. The HLS tool 104 may be a C-to-Silicon compiler (CtoS), which may receive a behavioral description of a hardware architecture for a chip. The behavioral description may be in a high-level language such as C, C++, or SystemC®. The HLS tool 104 may transform the behavioral description of the hardware architecture into a structural description of the hardware architecture. For example, the HLS tool 104 may transform untimed or partially timed functional code to a timed RTL implementation. The HLS tool 104 may output an RTL description 106 of a micro-architecture that will be implemented for the chip. The RTL description 106 may be in a typical language such as Verilog or VHDL.

The HLS tool 104 may define at least one annotation. An annotation may describe a path traversed through a behavioral description of the circuit (also referred to as a "high-level source code," "source code," or an "input model"). An annotation may identify a state in a process and/or a sequential function in a high-level source code. A function call may be identified in source code by a pragma and/or a label associated with a "wait" statement (also referred to as "wait( )" and as described herein. The annotation of a function call or a state may be an ordered list of annotation elements. Each element may originate from source code as: a wait label, a function call program, and/or from an iteration of an unrolled loop. An order of the annotation elements may be independent of an order of transformations.

The logic synthesizer 108 is an analysis and/or simulation tool. The logic synthesizer 108 may receive an RTL description 106 as input. The logic synthesizer 108 may output a gate-level implementation based on the RTL input. Among other things, the logic synthesizer 108 may output a finite state machine (FSM) analysis and a schematic 112. An FSM is machine modelling a finite number of states so that the model is only in a single state at a time. The model transitions between states in response to a triggering event or condition. A state in a FSM may be represented by a wait statement in a high-level language. It may be difficult to identify a state and/or wait statement due to transformations made by the HLS tool to the source code. For example, a name for a state may change in a code revision process or a name may change during a CtoS compilation process. The complexity and difficulty of tracking a state may be exacerbated by inlining functions, unrolling loops, optimizations, zipping of states, and other transformations of the source code by the HLS tool.

After the high-level language is compiled by the HLS tool 104, aspects of the design may be displayed in a user interface ("cockpit"). The cockpit may be used to run synthesis, analyze results, make adjustments to the design, and the like. A structure and flow of the design may be displayed in the cockpit. The structure and flow may include a high-level visualization of loops, branches, operations, timing elements, etc., which may be linked to the high-level language source code. This linking may help a user to understand the flow and interdependencies of the design. For example, an FSM diagram may be displayed in the cockpit to assist evaluation of a behavior of a circuit in various states and test cases. For instance, a user may step through each of the states of a FSM to determine path coverage. Typical methods for working with the FSM require a designer to analyze source code to determine whether to waive an alert.

The inventors perceived a need in the art for an HLS tool that allows a user to specify and maintain a name of a state node. The ability to define a state node would allow a user to refer to the state node using user-specified names, which may be more meaningful than machine-generated names provided by the HLS tool. This functionality is useful in many situations, including: (i) when a user analyzes a target design under synthesis, and (ii) review of an RTL model by a user who is not familiar with the HLS tool, for example those who do not understand high-level languages.

Methods and systems of the present disclosure provide: (i) annotating information with state nodes, which information may include labels and pragmas specified in a high-level language input model for wait statements, loop structures, and function calls, (ii) displaying and/or reporting the annotation information for a given state node, and (iii) specifying a name for a state node, where the annotation information may be used to locate a target state node. In an embodiment, a name specified for a state node may persist through successive runs of an HLS tool such as a CtoS compiler. In an embodiment, any combination of features (i) to (iii) are displayed on a single user interface to enable use of the features in combination.

Methods and systems of the present disclosure provide annotating information with state nodes. The information may include label(s) for a wait statement or a loop structure and a pragma for a function call, which information may be specified in a high-level language input model. The annotating of the state node may be in the form of a path annotation. The principles of the present disclosure are illustrated using the example of associating pragmas with function calls and labels with wait statements. The concepts apply also to associating other types of text with function calls and wait statements. For example, a first text may be associated with a function call and a second text may be associated with a wait statement.

FIG. 2 is a flowchart of a method 200 of creating a path annotation. The method 200 may define a path annotation for a state node based on an input model and a call point. The method 200 may receive information provided in a high-level language input model and create an annotation for a state node based on the received information. In 202, the method 200 may receive information useful for creating an annotation. The information may include a label for a wait statement, a loop structure, and/or a pragma for a function call. The method 200 may determine aspects of the input model and call point in 204 and 208. A call point may be a location in a portion of code from which a function is called. In 204, method 200 may determine whether the information received in 202 is complete. If the information is complete, the method 200 may proceed to "A" to define a path annotation. If the information is incomplete, the method 200 may proceed to "B" to define a path annotation. In 208, method 200 may determine whether a call point is inside an unrolled loop. If the call point is inside an unrolled loop, the method 200 may proceed to "C" to define a path annotation. The method 200 may define a path annotation based on other characteristics of the information received in 202 or the call (not shown). "C" may be performed in combination with "A" or "B," e.g., if more than one condition is true. For example if the method 200 determines that a call point is inside a unrolled loop in 208 and the information is incomplete, the method 200 may perform both "B" and "C".

FIG. 3 shows pseudo-code 300, which may be provided to an HLS tool ("CtoS compiler" for simplicity). Pseudo-code 300 ("code" for simplicity) is intended to aid in understanding of the methods of the present disclosure. Of course, other program code is possible. The code includes syntactical elements such as pragmas and labels. The syntactical elements may be specified by a user such as a designer of an algorithm of a hardware architecture using a high-level language. The code 300 may include a function call 302, "thread_main( )"; a function call 304, "control( )"; and a function call 306, "exe_cost( )". One or more of the functions 302, 304, 306 may include a pragma. A pragma may indicate information that is skipped over by a high-level language compiler. The pragma may be formatted and/or signaled in a variety of ways. In an embodiment, a pragma includes a keyword "#pragma" followed by a "ctos" keyword followed by an "annotate keyword," followed by a name for annotation. For example, code 300 includes a pragma, F_control, and a pragma, F_exe_cost_0. One or more of the functions 302, 304, 306 may include a label. The label may identify a corresponding wait statement. The label may be formatted and/or signaled in a variety of ways. In an embodiment, a label is signaled by preceding a "wait( )" with the label. For example, a label for wait( ) in function 306 is "W_modeset."

FIG. 4 is a flowchart of a method 400 to create a path annotation. In an embodiment, method 400 may be performed responsive to a determination that information received is complete (e.g., as determined in 204 shown in FIG. 2). The number of annotation elements in the path annotation may correspond to a number of functions calls such as a number of nested function calls to reach a wait statement corresponding to a state node. In 402, the method 400 may create an annotation element (also referred to as "text"), $\pi(C)$. The text, $\pi(C)$, may be readable by a user and is not necessarily a specific data structure. In an embodiment, $\pi(C)$ may be a template that may be populated with elements of a path annotation as the method traverses a portion of a source code. In an embodiment, $\pi(C)$ may begin as an empty string to which pragma(s) and label(s) may be concatenated. The method 400 may begin in a main function of a process defined in high-level code, traversing through the code until reaching a wait statement. In 404, when the method 400 encounters a pragma, the method 400 may add the pragma, $\pi(C_N)$, to the text $\pi(C)$, where N denotes the nth pragma in the sequence. For example, the n-th pragma in the sequence may be the pragma defined for the n-th function call in the sequence of functions calls that reaches the wait( ) statement corresponding to the state node. For instance, the method 400 may concatenate $\pi(C_N)$ to $\pi(C)$. In 406, when the method 400 encounters a wait( ) statement, the method 400 may add a corresponding label, $\lambda(w)$, to the text $\pi(C)$. For instance, the method 400 may concatenate $\lambda(w)$ to $\pi(C)$. The label at the end of the path annotation may be the label for the wait statement.

In 408, the method 400 may define a path annotation based on the text, $\pi(C)$. In an embodiment, for a state node that is reached by a sequence of function calls $(C_N)$ followed by a wait statement (w) given as $(C_1, \ldots, C_N, w)$, and the path annotation may be $(\pi(C_1), \ldots, \pi(C_N), \lambda(w))$. In an embodiment, the path annotation may include a number of pragmas followed by a label. In another embodiment, if the code does not include any pragmas, the path annotation may include a label without any pragmas.

Method 400 will now be explained with reference to exemplary code 300 shown in FIG. 3. Supposing that function 302 is a main function of a process to be synthesized by the CtoS, function 302 may call the function 304, which may in turn call the function 306. Inside function 306, there is a wait statement ("wait( )"). During a CtoS synthesis, a state node may be created to correspond to the wait statement. The sequence of calls outlined above is a sequence of function calls to reach the wait( ) statement. In this example, a pragma is specified for each of the function calls 302 and 304. The pragma for function 302 is F_control, and the pragma for function 304 is F_exe_cost_0. In this example, the label for the wait statement is W_modeset. When method 400 reaches pragma F_control in function 302, the method 400 may add F_control to $\pi(C)$. When method 400 reaches pragma F_exe_cost_0 in function 304, the method 400 may add F_exe_cost_0 to a text, $\pi(C)$. When method 400 reaches wait( ) in function 306, the method 400 may add label W_modeset to $\pi(C)$. Thus, a path annotation for this state node may be: F_control, F_exe_cost_0, W_modeset. An order of the annotation elements may be independent of an order of transformations.

A path annotation defined in this manner differs from typical functions such as tracking of a hierarchical path because the path annotation uses pragma(s) and label(s). In contrast to hierarchical paths, the pragma(s) and label(s) may be specified by a user. Also in contrast to hierarchical paths, the pragma(s) and label(s) may persist when the CtoS runs successively as discussed herein.

Figures 5, 6:
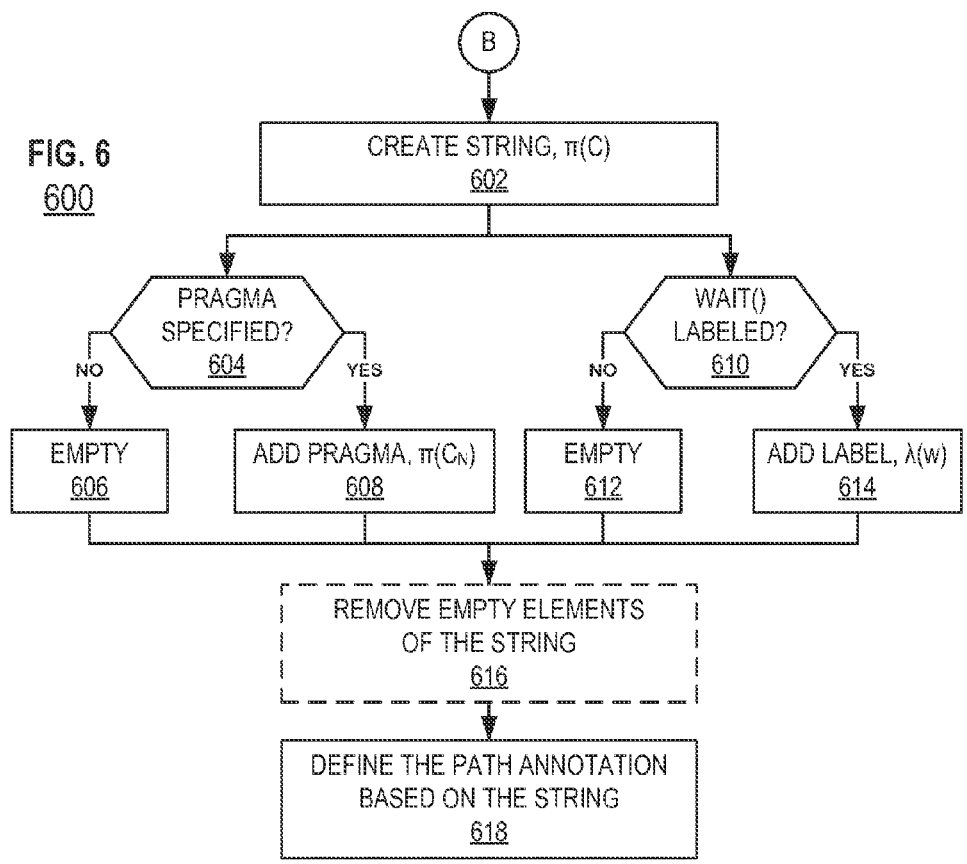
FIG. 5 shows pseudo-code provided to a CtoS compiler according to an embodiment.
FIG. 6 is a flowchart of a method to create a path annotation based on incomplete information according to an embodiment.

FIG. 5 shows pseudo-code 500, which may be provided to a CtoS compiler. FIG. 5 illustrates an example scenario in which information expected to be provided is missing. For example, a pragma may be missing from a function. Pseudo-code 500 ("code" for simplicity) is intended to aid in understanding of the methods of the present disclosure. Of course, other program code is possible. The code includes syntactical elements such as pragmas and labels. The syntactical elements may be specified by a user such as a designer of an algorithm of a hardware architecture using a high-level language. The code 500 may include a function call 502, "thread_main( )"; a function call 504, "control( )"; and a function call 506, "exe_cost( )". One or more of the functions 502, 504, 506 may include a pragma. A pragma may indicate information that is skipped over by a high-level language compiler. The pragma may be formatted and/or signaled in a variety of ways. In an embodiment, a pragma includes a keyword "#pragma" followed by a "ctos" keyword followed by an "annotate keyword," followed by a name for annotation. For example, code 500 includes a pragma, F_control. Note that in contrast to function 304 shown in FIG. 3, no pragma is included in function 504. One or more of the functions 502, 504, 506 may include a label. The label may identify a corresponding wait statement. The label may be formatted and/or signaled in a variety of ways. In an embodiment, a label is signaled by preceding a "wait( )" with the label. For example, a label for wait( ) in function 506 is "W_modeset." In an alternative embodiment, exe_cost( ) includes a wait( ) statement, but no label for the wait( ) statement (not shown).

FIG. 6 is a flowchart of a method 600 to create a path annotation. In an embodiment, method 600 may be performed responsive to a determination that information received is incomplete (e.g., as determined in 204 shown in FIG. 2). The number of pragmas in the path annotation may correspond to a sequence of functions calls to reach a wait statement corresponding to a state node. In 602, the method 600 may create a text, $\pi(C)$. In an embodiment, $\pi(C)$ may be a template that may be populated with elements of a path annotation as the method traverses a portion of a source code. In an embodiment, $\pi(C)$ may begin as an empty string to which pragma(s) and label(s) may be concatenated. The method 600 may begin in a main function of a process defined in high-level code, traversing through the code until reaching a wait statement. In 604, when the method 600 encounters a pragma, the method 600 may add the pragma, $\pi(C_N)$, to the text $\pi(C)$, where N denotes the nth pragma in the sequence. In an embodiment, if no pragma is encountered for a function, an empty string may represent the absence of the pragma (606). For example, the n-th pragma in the sequence may be the pragma defined for the n-th function call in the sequence of functions calls that reaches the wait( ) statement corresponding to the state node. The method 600 may concatenate $\pi(C_N)$ to $\pi(C)$, where $\pi(C_N)$ may be a pragma or an empty string. In 610, when the method 600 encounters a wait( ) statement, the method 600 may add a corresponding label, $\lambda(w)$, to the text $\pi(C)$. For instance, the method 600 may concatenate $\lambda(w)$ to $\pi(C)$. The label at the end of the path annotation may be the label for the wait statement. In an embodiment, if no label is associated with a wait( ) statement, an empty string may represent the absence of the label (612). For instance, the method 600 may concatenate $\lambda(w)$ to $\pi(C)$, where $\lambda(w)$ may be a label or an empty string.

In 618, the method 600 may define the path annotation based on the string. In an embodiment, for a state node that is reached by a sequence of function calls ($C_N$) followed by a wait statement (w) given as ($C_1, \ldots, C_N$, w), the path annotation may be: ($\pi(C_1), \ldots, \pi(C_N), \lambda(w)$). In an embodiment, the path annotation may include a number of pragmas followed by a label. In another embodiment, if the code does not include any pragmas, the path annotation may include a label without any pragmas.

In an embodiment, the method 600 may perform 616 before defining the path annotation. The method 600 may remove empty string(s) from the assembled string: ($\pi(C_1), \ldots, \pi(C_N), \lambda(w)$). In an alternative embodiment, 616 is not performed. For example, when no pragma is specified (606) or a wait( ) statement is not labeled (612), the method 600 may simply not modify $\pi(C)$.

Method 600 will now be explained with reference to exemplary code 500 shown in FIG. 5. Supposing that function 502 is a main function of a process to be synthesized by the CtoS, function 502 may call the function 504, which may in turn call the function 506. Inside function 506, there is a wait statement ("wait( )"). During a CtoS synthesis, a state node may be created to correspond to the wait statement. The sequence of calls outlined above is a sequence of function calls to reach the wait( ) statement. In this example, a pragma is specified for function call 502. A pragma is not specified for function call 504. The pragma for function 502 is F_control. In this example, the label for the wait statement is W_modeset. When method 600 reaches pragma F_control in function 502, the method 600 may add F_control to $\pi(C)$ (608). In 604, when method 600 reaches function control( ) 504, the method 600 may determine that no pragma is specified, and the method 600 may add an empty text or string to $\pi(C)$ (606). In an alternative embodiment, the method 600 may simply not add anything to the text $\pi(C)$ and continue to the next function. In 610, when method 600 reaches wait( ) in function 306, the method 600 may add label W_modeset to $\pi(C)$ (614).

In 618, the method 600 may define a path annotation for this state node as: F_control, W_modeset. In an embodiment, the method 600 may perform 616 before defining the path annotation. The method 600 may remove empty strings from the assembled string: $(\pi(C_1), \ldots, \pi(C_N), \lambda(w))$. That is, the method 600 may remove the empty string associated with function 504. In an alternative embodiment, 616 is not performed. For example, when no pragma is specified (606) or a wait( ) statement is not labeled (612), the method 600 may simply not add any string to $\pi(C)$. A resulting path annotation may be the same regardless of whether an empty string is removed or not added in the first place.

Figures 7, 8:
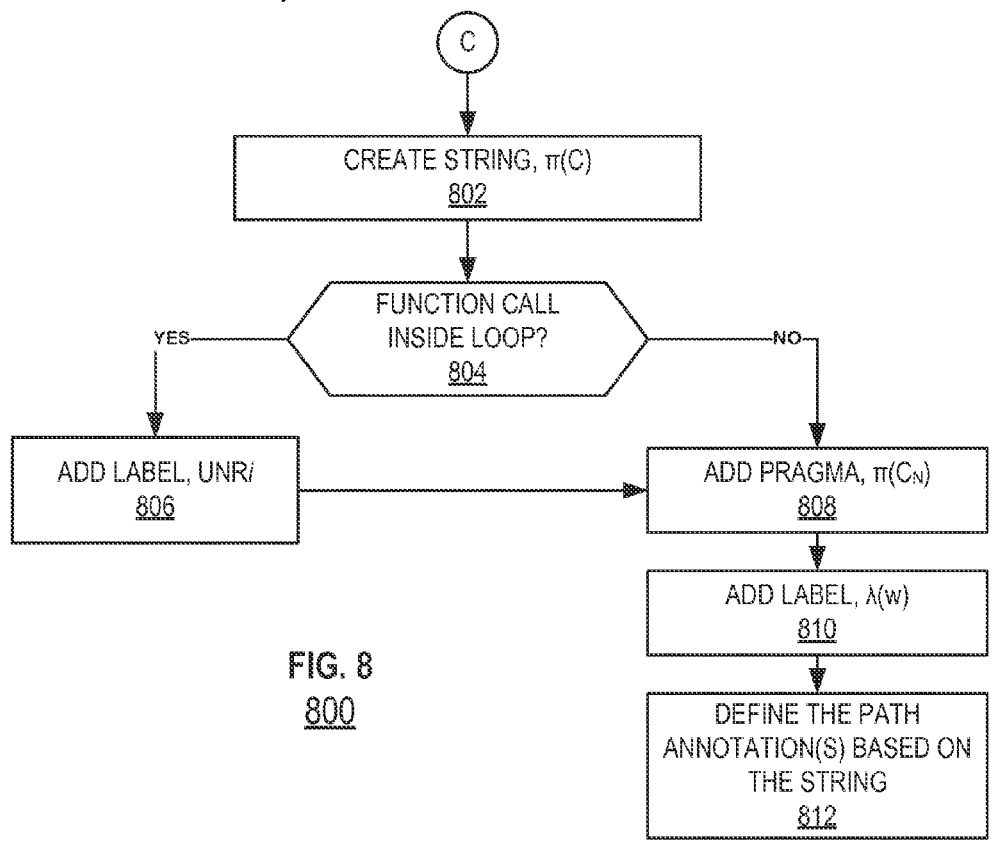
FIG. 7 shows pseudo-code provided to a CtoS compiler according to an embodiment.
FIG. 8 is a flowchart of a method to create a path annotation for a call point from inside a loop according to an embodiment.

FIG. 7 shows pseudo-code 700, which may be provided to a CtoS compiler. FIG. 7 illustrates an example scenario in which a function includes a loop. Pseudo-code 700 ("code" for simplicity) is intended to aid in understanding of the methods of the present disclosure. Of course, other program code is possible. The code includes syntactical elements such as pragmas and labels. The syntactical elements may be specified by a user such as a designer of an algorithm of a hardware architecture using a high-level language. The code 700 may include a function call 702, "thread_main( )"; a function call 704, "control( )"; and a function call 706, "exe_cost( )". One or more of the functions 702, 704, 706 may include a pragma. A pragma may indicate information that is skipped over by a high-level language compiler. The pragma may be formatted and/or signaled in a variety of ways. In an embodiment, a pragma includes a keyword "#pragma" followed by a "ctos" keyword followed by an "annotate keyword," followed by a name for annotation. For example, code 700 includes a pragma, F_control, and a pragma, F_exe_cost_0.

Note that in contrast to function 302 shown in FIG. 3, function 702 includes a loop. By way of non-limiting example, the loop is a "for" loop. At least one call point may be inside the loop. For example, the function call of control( ) is inside the "for" loop. The for loop may be "unrolled," i.e., each iteration may be traversed to unroll the loop. Unrolling a loop containing a function call and/or state may result in a creation of a function call and/or a state from those in the loop for each iteration. The annotation of a created function call and/or state may be as described herein. One or more of the functions 702, 704, 706 may include a label. The label may identify a corresponding wait( ) statement. The label may be signaled in a variety of ways. In an embodiment, a label is signaled by preceding a "wait( )" with the label. For example, a label for wait( ) in function 706 is "W_modeset."

FIG. 8 is a flowchart of a method 800 to create a path annotation. In an embodiment, method 800 may be performed responsive to a determination that a call point is within a loop (e.g., as determined in 208 shown in FIG. 2). The number of pragmas in the path annotation may correspond to a sequence of functions calls to reach a wait( ) statement corresponding to a state node. In 802, the method 800 may create a text, $\pi(C)$. In an embodiment, $\pi(C)$ may be a template that may be populated with elements of a path annotation as the method traverses a portion of a source code. In an embodiment, $\pi(C)$ may begin as an empty string to which pragma(s) and label(s) may be concatenated. The method 800 may begin in a main function of a process defined in high-level code, traversing through the code until reaching a wait statement.

In 804, the method 800 may determine whether a function call is made from within a loop. If so, the method 800 may add a label to the text $\pi(C)$. The label may be pre-defined and form an annotation path, e.g., by being incorporate into the annotation path. For example, the label may be defined by a user or automatically defined by a system. In an embodiment, the label may be a text followed by an iteration number. For example, the text may be a label followed by an iteration tracker, where the text may be pre-defined. As another example, the text may be a string "unri," where i denotes an iteration count of a current loop being unrolled. "unri" may be added to a position in the string that is compatible with an execution sequence of the function calls and the iteration count of the loops that have been unrolled. Method 800 may concatenate unri to $\pi(C)$. Alternative annotations for unrolled loops are possible. For example, annotations may be of varying degrees of descriptiveness. An annotation for an unrolled loop may be LOOP_unri, where i denotes an iteration count of a current loop being unrolled. In an embodiment, a loop join node may be annotated with a name of a preceding label node.

The method 800 may then proceed to 808. In 808, when the method 800 encounters a pragma, the method 800 may add the pragma, $\pi(C_N)$, to the text $\pi(C)$, where N denotes the nth pragma in the sequence. For example, the n-th pragma in the sequence may be the pragma defined for the n-th function call in the stack of active functions calls that reaches the wait( ) statement corresponding to the state node. For instance, the method 800 may concatenate $\pi(C_N)$ to $\pi(C)$. In 810, when the method 800 encounters a wait( ) statement, the method 800 may add a corresponding label, $\lambda(w)$, to the text $\pi(C)$. For instance, the method 800 may concatenate $\lambda(w)$ to $\pi(C)$. The label at the end of the path annotation may be the label for the wait statement.

In 812, the method 800 may define the path annotation based on the text, $\pi(C)$. In an embodiment, for a state node that is reached by a sequence of function calls $(C_N)$ followed by a wait statement (w) given as $(C_1, \ldots, C_N, w)$, a path annotation may be: unri, $\pi(C_1), \ldots, \pi(C_N), \lambda(w)$. In an embodiment, a set of path annotations corresponding to a set of state nodes may be generated of the form: unr0, $\pi(C_1), \ldots, \pi(C_N), \lambda(w)$; unr1, $\pi(C_1), \ldots, \pi(C_N), \lambda(w); \ldots$ unrN, $\pi(C_1), \ldots, \pi(C_N), \lambda(w)$ corresponding to the number iterations in the loop. In an embodiment, the path annotation may include a number of pragmas followed by a label. In another embodiment, if the code does not include any pragmas, the path annotation may include a label without any pragmas.

Method 800 will now be explained with reference to exemplary code 700 shown in FIG. 7. Supposing that function 702 is a main function of a process to be synthesized by the CtoS, function 702 may call the function 704 for each iteration of the for loop (eight times for i=0 to i=7). Function 704 may in turn call the function 706. Inside function 706, there is a wait( ) function. During a CtoS synthesis, a state node may be created to correspond to the wait( ) function. The sequence of calls outlined above is a sequence of function calls to reach the wait( ) statement.

Beginning with a first iteration, i.e., i=0, the method 800 may create a text, $\pi(C)$ in 802. The method 800 may then determine whether the function call is being made inside a loop (804). Here, the call point is from within a for loop. Thus, the method 800 may proceed to 806 to add a label, e.g., "unr0" to the text $\pi(C)$. Method 800 may then proceed to 808. In this example, a pragma is specified for function call 702. The pragma for function 702 is F_control. When method 800 reaches pragma F_control in function 702, the method 800 may add F_control to $\pi(C)$ (806). In 810, when method 800 reaches wait( ) in function 706. In this example, the label for the wait( ) statement is W_modeset. The method 800 may add label W_modeset to $\pi(C)$.

In 812, the method 800 may define a path annotation for this state node as: F_control, W_modeset. If additional iteration(s) of the loop remain, the method 800 may return to 804 to create a path annotation for the next iteration, e.g., i=1. After completing all iterations of the for loop, a set of state nodes may be given by the path annotations: (unr0, F_control, W_modeset), ... (unr7, F_control, W_modeset).

As described herein, other source code features include, but are not limited to, in-line functions, loops, optimizations, and other transformations. State nodes may have more than one path annotation as a result of the transformations. Source code features may be handled according to Table 1. A non-inlined sequential function may be a root for the annotation. An idle state may be named automatically, e.g. without an annotation (not shown in Table 1).

TABLE 1

| Description | Path Annotation |
| --- | --- |
| Inlined sequential function | An annotation may be preserved in an inline state. An idle state may be removed. An annotation of a call may be included in the annotation. |
| Pipeline loop | An annotation may be preserved in states that remain. An added state may be omitted from an annotation. |
| Zipping | A merged state node may have a union of annotation(s) of merged nodes. |
| Wait(n) statement | An annotation may include i, where i is 0 through n − 1. |
| Complex expression, e.g., x = mult(a, b) + mult(c, d) | Annotation(s) may be applied to a first function call. |

Methods and systems of the present disclosure provide displaying and/or reporting the annotation information for a given state node. FIG. 9 is a simplified report 900 of annotation information according to an embodiment. The report may include one or more annotation paths for a state. For example, if a state has more than one annotation path, the report may include more than on annotation path for the state. The report may be displayed on a user interface or a display device. In an embodiment, the report may be displayed in response to a request by the user. In an alternative embodiment, the report may be automatically displayed in response to defining a path annotation, e.g., in response to a step of method 200. The report may be generated following completion of scheduling for a given behavior.

Report 900 may include at least one path annotation defined for a state node for a given behavior. In an embodiment, the report includes, for each state node belonging to the behavior, a name of the state node, a path annotation, and a hierarchical path. Report 900 may be for a given behavior, my_design_thread_main. Report 900 may include a state name of each state node belonging to the my_design_thread_main behavior. For example, a state name of a first state node may be "wait_ln3904" and a state name of a second state node may be "wait_ln3904_0unr0". Report 900 may include at least one path annotation for each state. For example, state wait_ln3904 corresponds to a path annotation: F_control, F_exe_cost0, W_modeset. The report 900 may include a hierarchical path for a corresponding state. For example, state wait_ln3904 corresponds to hierarchical path: control_ln553, exe_cost_ln1403, Wait_ln3904. Each element of the path annotation may correspond to an element of a hierarchical path, e.g., F_control may correspond to control_ln553, F_exe_cost_0 may correspond to exe_cost_ln1403, and W_modeset may correspond to Wait_ln3904. State wait_ln3904 shown in report 900 may correspond to code 300, and the path annotation may be defined according to method 400.

Report 900 may include a second state node, wait_ln3904_0unr0 with path annotation (unr0, W_modeset). A first string in the path annotation may correspond to an iteration count 0 of a loop identified as for_ln1604 (iteration 0) that has been unrolled. The second string, W_modeset, may correspond to a wait statement for the state node. In an example, no corresponding path annotation string is displayed for exe_cost_ln1620 because no pragma is included in the source code. The state node may involve a function call of exe_cost( ) identified as exe_cost_ln1620 in the hierarchical path.

Report 900 is shown in table form, but other formats are possible, e.g., other configurations of rows and columns, pop-up windows, etc. Any of the columns shown in FIG. 9 may be omitted from the report, e.g., at the option of a user. Report 900 may be accessed and modified by user commands. For example, a scripting language such as Tcl may be configured so that a user can issue a command for a particular behavior, as a subset of behaviors, or all behaviors in a target design. If a command is made for all behaviors in a target design, a report may be structured such that state nodes for each behavior are grouped together. As another example, a Tcl command may yield a name and/or annotation of all states of a behavior. The information provided in report 900 may serve a variety of purposes including, among others, allowing a user to review path annotations, define states to change, add pragmas or labels to an input model, and/or specify a name for a state node, as discussed herein.

Methods and systems of the present disclosure provide for specifying a name for a state node, where annotation information may be used to locate a target state node. The specification may be made by a user. In an embodiment, a user may define a name of a state node by using a path annotation as a key to locate the node. A user specification may be provided as a table. In an embodiment, a name for an annotation may be provided once and reused during subsequent run(s). Methods and systems provide locating state(s) in a behavior for an annotation and setting a name for the located state(s).

FIG. 11 is a simplified table 1100 of annotation information including a user-specified name for a state node. Table 1100 may be provided by a user or based on information provided by a user. In an embodiment, table 1100 may be defined for a single design that is specified as a target design. The file may be organized based on individual behaviors. Each behavior may be specified by a keyword followed by a set of state node(s) that belong to the behavior. For example, the keyword may be "Behavior:".

Table 1100 may include at least one path annotation defined for a state node for a given behavior. Table 1100 may be for a given behavior, my_design_thread_main. In an embodiment, the table includes, for each state node belonging to the behavior, a user-specified name ("logical name") of the state node, a path annotation, and a hierarchical path. In other words, a logical name may be a name provided by a user for a state node. For example, a logical name of a first state node may be "Present_mode_complete" and a logical name of a second state node may be "ChrInit_mode_complete". Table 1100 may include at least one path annotation for each state. For example, state Present_mode_complete may correspond to path annotation: F_control, F_exe_cost0, W_modeset. The report 1100 may include a hierarchical path for a corresponding state and a portion of a path annotation. For example, path annotation "F_control" may correspond to hierarchical path element "control_ln553," path annotation "F_exe_cost_0" may correspond to hierarchical path element "exe_cos_ln1403," and path annotation "W_modeset" may correspond to hierarchical path element "Wait_ln3904."

Table 1100 may include a second state node, ChrInit_mode_complete with path annotation (unr0, W_modeset). A first string in the path annotation may correspond to an iteration count 0 of a loop identified as for_ln1604 (iteration 0) that has been unrolled. The second string, W_modeset, may correspond to a wait statement for the state node. In an example, no corresponding path annotation string is displayed for exe_cost_ln1620 because no pragma is included in the source code. The state node may involve a function call of exe_cost( ) identified as exe_cost_ln1620 in the hierarchical path.

Table 1100 is shown in table form, but other formats are possible, e.g., a text-based file. In an embodiment, the format of table 1100 is compatible with a format of a report generated according to the methods described herein, e.g., report 900 shown in FIG. 9. Table 1100 may be accessed and modified by user commands.

FIG. 10 is a flowchart of a method 1000 to name a state node. In 1002, the method 1000 may receive a name ("logical name") of a state node. The logical name of the state node may be specified using a corresponding path annotation. The logical name and path annotation may be received as an input text file. For example, the text file may be formatted according to table 1100 shown in FIG. 11 and as described herein. Returning to FIG. 10, in 1004, the method 1000 may locate a state node in the design whose path annotation matches the provided path annotation(s). The method 1000 may locate the state node based on the path annotation as a key. If the method 1000 does not locate a state node with a matching path annotation, the method 1000 may provide an alert (1006). The alert may report that no state node was located. For example, the alert may be provided in an audio, visual, and/or haptic form. If the method 1000 locates a state node in 1004, the method may then determine whether a unique state node has been located. In other words, the method 1000 may determine whether more than one state node is found for the received path annotation. If the method 1000 uniquely locates a state node, the method may associate the state node with the received logical name (1010). In an embodiment, the method 1000 may change the name of the node to the specified logical name. If, however, in 1008, the method 1000 locates more than one state node corresponding to the path annotation, the method 1000 may create a unique name for each state node in 1012. In an embodiment, the method 1000 may create a unique name by appending a string to the logical name so that the resulting name is unique compared with all of the names of the nodes in the design. The method 1000 may then associate the state node with the generated unique name. In 1014, the method 1000 may provide an alert regarding the multiple nodes found for the received path annotation. In an embodiment, the alert includes a path annotation and a unique name generated and used for each state node associated with the same path annotation. For example, the alert may be provided in an audio, visual, and/or haptic form.

The method 1000 may include error checks for user-provided names (not shown). For example, the method may issue an error for names that conflict with names of: nets, instances, arrays, nodes of a same behavior, states in other behaviors of the same module. A name of a state may be changed at any time. For example, a state may be renamed after writing RTL, in which case, a result of a subsequent write RTL command may result in an RTL netlist with the new name. A connect command may be called before and/or after naming a state to create a net based on the renamed state. The connect command may avoid name conflicts between net names and user state names, e.g., by issuing an error, as described herein.

A script in a language such as Tcl may be configured to trigger and/or modify method 1000. A Tcl command may take, as an option, a name of a behavior for which method 1000 is to be applied. The Tcl command may narrow a scope in which a state is searched for user-specified annotation information. In an embodiment, if the specified behavior is found in a design, the method 1000 may be applied for state nodes of the behavior listed in the design. In an embodiment, if the specified behavior is found in a design, the method 1000 may be applied for user-specified annotation information. Otherwise, an alert may be provided to indicate that the specified behavior is not located in the design. The script may be sourced before writing RTL such that a same user state name persists after each synthesis run.

Figure 12:
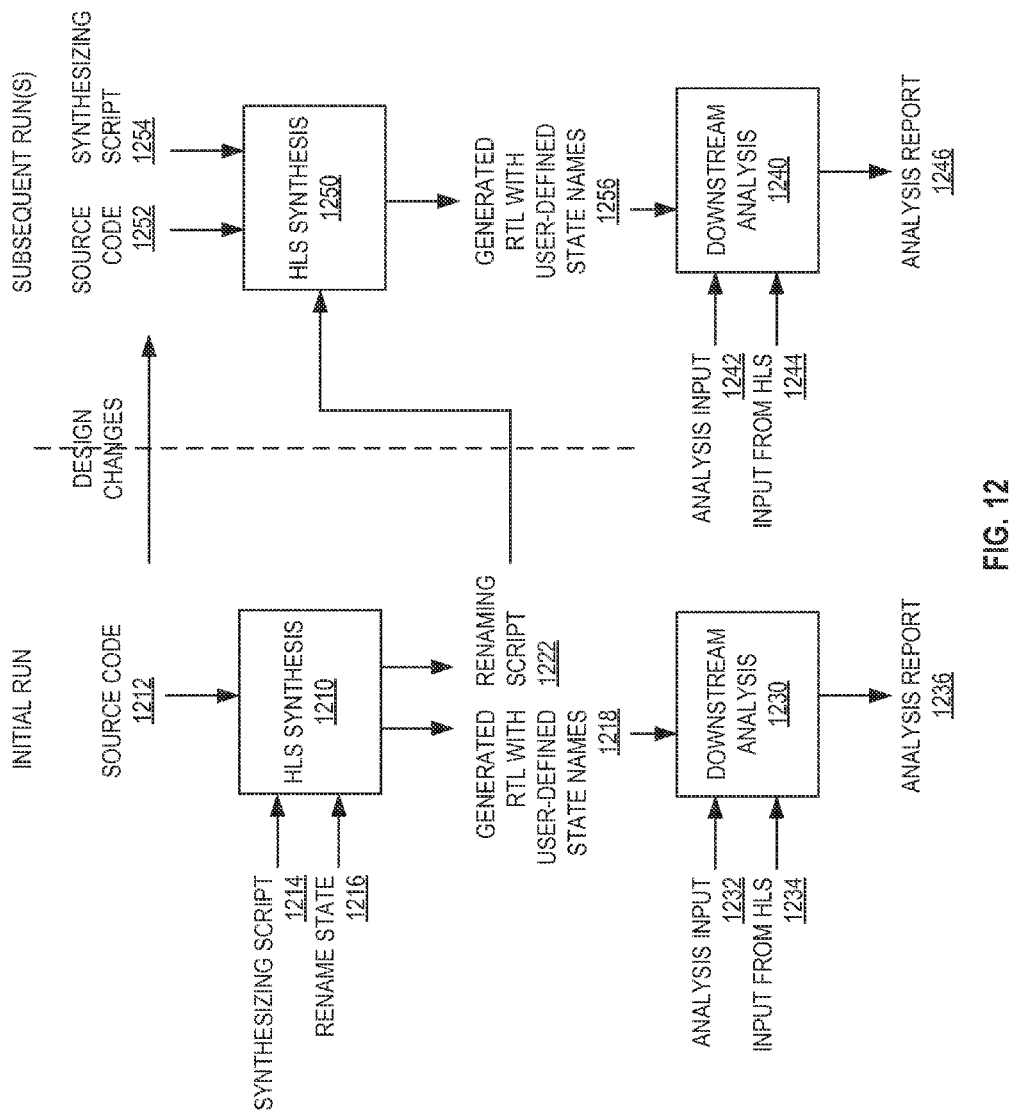
FIG. 12 is a simplified block diagram of a high level synthesis (HLS) system according to an embodiment.

FIG. 12 is a simplified block diagram of an HLS system 1210, 1250 in two modes of operation. In a first mode of operation ("initial run"), the HLS synthesizer 1210 may receive as input: source code 1212, synthesizing script 1214, and input 1216 for renaming a state node. The source code may be in a high-level language such as C, C++, or SystemC®. The source code may include an annotation, a pragma, and/or a label. FIGS. 3, 5, and 7 are examples of source code that may be received. The synthesizing script 1214 may include instructions for performing one or more of the methods described herein. For example, the script may cause the HLS synthesizer 1210 to (i) annotate information with state nodes (e.g., as shown in FIGS. 2, 4, 6, and 8) and/or (ii) display and/or report the annotation information for a given state node (e.g., as shown in FIG. 9). The HLS synthesizer 1210 may output a generated RTL with user-defined state names 1218 and a renaming script 1222. The renaming script 1222 may include instructions for performing one or more of the methods discussed herein. For example, the script may cause the HLS synthesizer 1210 to receive and apply a user specification of a name for a state node (e.g., as shown in FIGS. 10 and 11). The renaming script 1222 may be used by subsequent run(s) of the HLS process. Although described as an "initial run," the mode of operation described in association with the initial run may be performed subsequent to previous runs of the source code 1212. The initial run refers to an initial instance during which a user provides information 1216 for renaming a state.

In a second mode of operation ("subsequent run"), the HLS synthesizer 1250 may receive as input the renaming script 1222. HLS synthesizer 1250 may also receive as input: source code 1252 and synthesizing script 1254. Based on the renaming script 1222, the HLS synthesizer 1250 may identify state node(s) associated with user-specified state name(s) across several runs. The source code may be in a high-level language such as C, C++, or SystemC®. The source code may include an annotation, a pragma, and/or a label. FIGS. 3, 5, and 7 are examples of source code that may be received. Run(s) subsequent to an initial run may include changes to the source code 1212. For instance, source code 1252 may include modifications to source code 1212. The synthesizing script 1254 may include instructions for performing one or more of the methods described herein. For example, the script may cause the HLS synthesizer 1250 to (i) annotate information with state nodes (e.g., as shown in FIGS. 2, 4, 6, and 8), (ii) display and/or report the annotation information for a given state node (e.g., as shown in FIG. 9), and/or (iii) associate a user-specified name with a state node (e.g., as shown in FIGS. 10 and 11). The HLS synthesizer 1250 may output a generated RTL with user-defined state names 1256, where the state names may be those defined in an earlier run. That is, a user-defined state name may persist through at least two runs.

FIG. 12 also shows downstream analysis systems 1230, 1240 corresponding to the initial run and the subsequent run(s). The downstream analysis system may perform verification coverage analysis, formal reachability analysis, and the like. The downstream analysis system 1230 may receive an analysis input 1232. The analysis input may include simulation information for verification. The analysis input may be an input separate from RTL. The downstream analysis system 1230 may receive input from HLS 1234. The input 1234 may include information about generated RTL. In an embodiment, the HLS input 1234 may be directly obtained from the HLS synthesis system 1210 without an additional linkage (not shown). The downstream analysis system 1230 may output an analysis report 1236. The analysis report 1236 may display analysis metrics. The analysis report may be rendered on a user interface. The analysis report 1236 may direct a user to objects in input that correspond to a particular metric.

In operation, the generated RTL 1218 may be input to the downstream analysis system 1230. The downstream analysis system 1230 may perform verification based on the generated RTL 1218, the analysis input 1232, and the input from HLS 1234. In an embodiment, verification analysis may include using coverage to measure an extent to which a design is verified. Verification coverage metrics may include FSM state transition coverage, line coverage, branch coverage, and the like, with respect to the generated RTL. In an embodiment, measuring metrics may direct a user to objects in the generated RTL that are of interest. For example, objects that are not covered or have an unexpected behavior may be flagged. The downstream analysis system 1230 may perform formal reachability analysis based on the generated RTL 1218, the analysis input 1232, and the input from HLS 1234. In an embodiment, formal reachability analysis may include applying formal methods to the generated RTL 1218 to determine whether any transitions in an FSM are not reachable in certain circumstances. The formal reachability analysis may indicate states in a generated RTL.

Based on the output of the downstream analysis system 1230, metrics may be related to the input source code 1212. The relationship may clearly indicate potential problem areas in the input source code. In contrast to conventional techniques, the indication of the potential problem areas may be easy to interpret and quickly generated.

Similarly, the downstream analysis system 1240 may operate on one or more subsequent runs. The downstream analysis system 1240 may receive an analysis input 1242. The analysis input may include simulation information for verification. The analysis input may be an input separate from RTL. The downstream analysis system 1240 may receive input from HLS 1244. The input 1244 may include information about generated RTL. In an embodiment, the HLS input 1244 may be directly obtained from the HLS synthesis system 1250 without an additional linkage (not shown). The downstream analysis system 1240 may output an analysis report 1246. The analysis report 1246 may display analysis metrics. The analysis report may be rendered on a user interface. The analysis report 1246 may direct a user to objects in input that correspond to a particular metric.

In operation, the generated RTL 1256 may be input to the downstream analysis system 1240. The downstream analysis system 1240 may perform verification based on the generated RTL 1256, the analysis input 1242, and the input from HLS 1244. In an embodiment, verification analysis may include using coverage to measure an extent to which a design is verified. Verification coverage metrics may include FSM state transition coverage, line coverage, branch coverage, and the like, with respect to the generated RTL. In an embodiment, measuring metrics may direct a user to objects in the generated RTL that are of interest. For example, objects that are not covered or have an unexpected behavior may be flagged. The downstream analysis system 1240 may perform formal reachability analysis based on the generated RTL 1256, the analysis input 1242, and the input from HLS 1244. In an embodiment, formal reachability analysis may include applying formal methods to the generated RTL 1256 to determine whether any transitions in an FSM are not reachable in certain circumstances. The formal reachability analysis may indicate states in a generated RTL.

Based on the output of the downstream analysis system 1240, metrics may be related to the input source code 1252. The relationship may clearly indicate potential problem areas in the input source code. In contrast to conventional techniques, the indication of the potential problem areas may be easy to interpret and quickly generated. Based on the output of the downstream analysis system 1240, metrics collected over multiple versions of generated RTL, which may result from changes to the input source code 1252, may be related and compared to each other. In an embodiment, metrics collected from an initial run, e.g., the analysis report 1236 can be compared to the metrics collected from a subsequent run with design changes, e.g., the analysis report 1246. This may be extended to include the metrics generated over more than two runs.

The methods and systems described herein have particular utility in electronic design and verification automation in conjunction with the features of annotating state nodes, reporting annotations, and naming state nodes. While the description here pertains to creating and renaming annotations, the concepts described here apply as well to tracking other aspects of text, e.g., source code in the context of electronic design and verification automation. For example, annotations may be used for function calls, loops, lines of statements, branches, etc. in addition to wait statements as described herein. The annotations may persist through various states and/or changes.

Figure 13:
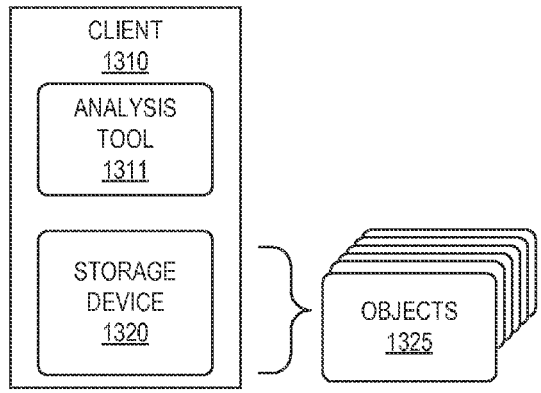
FIG. 13 is a simplified block diagram of a system according to an embodiment.

FIG. 13 is a simplified block diagram of a system implementing the methods and systems described herein. As shown in FIG. 13, a system 1300 may include a client 1310 executing an analysis tool 1311 and having a storage apparatus 1320. The analysis tool 1311 may be configured to perform the methods described herein. The client 1310 may be any computing system that executes an analysis tool 1311 or otherwise facilitates access to storage 1320, for example a personal computer. The client 1310 may include a processor that performs a method in accordance with the disclosed embodiments. Such a client may be a tool environment or may be part of an overall test system in accordance with the disclosed embodiments.

Hardware models, instruction sets, software packages, timing files, netlists and other objects 1325 used by the analysis tool 1311 may be stored in storage 1320. A user may access the objects 1325 stored in storage 1320 with the client 1310 via the analysis tool 1311, where the analysis tool 1311 is capable of accessing storage apparatus 1320 and displaying the objects 1325 and the data associated with the objects. The analysis tool 1311 may include a user interface, for example a program, application or middleware that acts as a front end to and facilitates access to objects in storage 1320. The analysis tool 1311 may facilitate one-to-one correspondence definition using the tools and procedures described herein. The user may interact with the analysis tool 1311 through a number of input devices, such as by inputting a selection as with a mouse or inputting a request as with a keyboard. The user may observe the analysis results on an output device or display. The analysis tool 1311 may run in an application window controlled by the user. As shown in FIG. 13, a client 1310 may be a stand-alone system, as may be of particular interest where the components being analyzed and tested are highly confidential.

Figure 14:
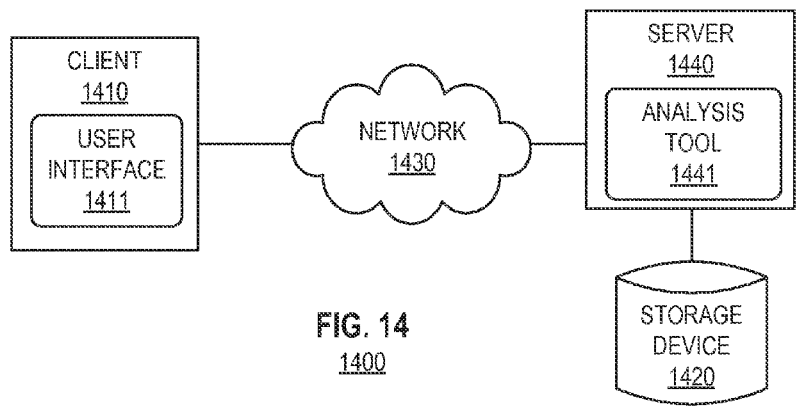
FIG. 14 is a simplified block diagram of a system according to an embodiment.

FIG. 14 is a simple block diagram illustrating components of an exemplary system 1400 according to an embodiment. As shown in FIG. 14, system 1400 may include a client 1410 having a user interface 1411. The client 1410 may be connected to a server 1440 via a network 1430. The analysis tool 1441, which in this embodiment is located at server 1440, may have access to storage device 1420 storing hardware models, instruction sets, software packages, timing files, netlists and other objects utilized by the analysis tool 1441. The storage device 1420 may be a stand-alone storage system, or may be part of server 1440. The server 1440 may include a processor that performs a method in accordance with the disclosed embodiments. Such a server then would be part of an overall test system in accordance with the disclosed embodiments.

A user may access an analysis tool 1441 at the server 1440 via the client 1410 having a user interface 1411 capable of accessing and displaying the design and the results of the one-to-one correspondence definition. The client 1410 may be any computing system that facilitates the user accessing storage device 1420, for example a personal computer. The network 1430 may be a wired or wireless network that may include a local area network (LAN), a wireless network, the Internet, or any other network available for accessing the analysis tool 1441 and storage device 1420 from the client 1410.

The server 1440 may be a network server accessible to the client 1410 via the network 1430 that may manage access to storage device 1420. The user interface 1411 may receive instructions regarding testing a design from the user and utilizing the objects stored in memory storage 1420, facilitate a display of the analysis or the information gathered during the analysis. Multiple different clients (not shown) may access storage device 1420 via the network 1430 and request access to the objects stored therein. In another networked environment, the analysis tool may be executed on a network capable client and access the models, packages and other objects stored in one or more storage devices via a network and communications server. As shown in FIG. 14, a client 1410 may be a stand-alone system, as may be of particular interest where the components being simulated are highly confidential. Alternatively, client 1410 may be part of a networked environment.

Figure 15:
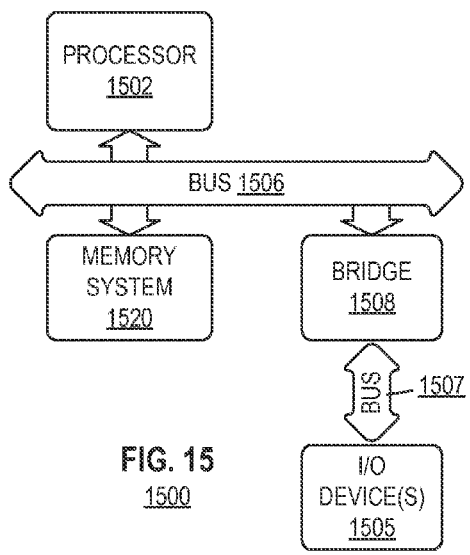
FIG. 15 is a simplified block diagram of a system according to an embodiment.

FIG. 15 is a simplified block diagram of a device 1500 implementing the methods and systems described herein. As shown in FIG. 15, the device 1500 may include a processor 1502, a memory system 1520, and at least one input/output (I/O) device 1505. The processor may be implemented according to the methods and systems described herein. For example, the processor may be configured to perform the steps of methods 200, 400, 600, 800, and 1000 as shown in FIGS. 2, 4, 6, 8, and 10.

The processor 1502, memory system 1520, and I/O device(s) 1505 may be communicatively coupled to each other. The communication may be implemented in a variety of ways, e.g., via at least one computer bus 1506 and/or bridge device 1508. The I/O device(s) 705 may include network adapters and/or mass storage devices from which the device 1500 may receive commands for executing the methods described herein. The I/O device(s) 1505 may be implemented according to the methods and systems described herein. For example, the I/O device(s) may receive input from a user, e.g., a matching command.

Although the foregoing description includes several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

As used in the appended claims, the term "computer-readable medium" may include a single medium or multiple media, such as a centralized or distributed database, and/or associated caches and servers that store one or more sets of instructions. The term shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

The present specification describes components and functions that may be implemented in particular embodiments which may operate in accordance with one or more particular standards and protocols. However, the disclosure is not limited to such standards and protocols. Such standards periodically may be superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

For example, operation of the disclosed embodiments has been described in the context of servers and terminals that implement analysis tools in electronic design automation (EDA) applications. These systems can be embodied in electronic devices or integrated circuits, such as application specific integrated circuits, field programmable gate arrays and/or digital signal processors. Alternatively, they can be embodied in computer programs that execute on personal computers, notebook computers, tablets, smartphones or computer servers. Such computer programs typically are stored in physical storage media such as electronic-, magnetic- and/or optically-based storage devices, where they may be read to a processor, under control of an operating system and executed. And, of course, these components may be provided as hybrid systems that distribute functionality across dedicated hardware components and programmed general-purpose processors, as desired.

In addition, in the foregoing Detailed Description, various features may be grouped or described together the purpose of streamlining the disclosure. This disclosure is not to be interpreted as reflecting an intention that all such features are required to provide an operable embodiment, nor that the claimed embodiments require more features than are expressly recited in each claim. Rather, as the following claims reflect, subject matter may be directed to less than all of the features of any of the disclosed embodiments. Thus, the following claims are incorporated into the Detailed Description, with each claim standing on its own as defining separately claimed subject matter.

Also, where certain claims recite methods, sequence of recitation of a particular method in a claim does not require that that sequence is essential to an operable claim. Rather, particular method elements or steps could be executed in different orders without departing from the scope or spirit of the invention.

What is claimed is:

1. A processor-implemented method for an electronic design and verification tool to synthesize a behavioral description of a circuit into a structural description of the circuit, the method comprising:
using a processor:
  facilitating generation of the structural description of the circuit by:
    parsing the behavioral description of the circuit to identify a first text and/or a second text;
    defining a path annotation based on the identified first text and/or the identified second text; and
    annotating a state node with the path annotation; and
  generating the structural description of the circuit based on the facilitating.

2. The method of claim 1, wherein the defining the path annotation includes, for each function call:
  responsive to an identification of a first text, modifying the path annotation to include the first text; and
  responsive to an identification of a wait statement, modifying the path annotation to include a second text associated with the wait statement.

3. The method of claim 1, wherein the defining the path annotation includes, for each function call:
  responsive to a determination, by the processor, that a first text is specified, modifying the path annotation to include the first text; and
  responsive to a determination that a second text is associated with a wait statement, modifying the path annotation to include the second text associated with the wait statement.

4. The method of claim 3, wherein the defining the path annotation further includes, for each function call:
  responsive to a determination that the behavioral description of the circuit includes a function call missing one of a first text and a second text, modifying the path annotation to include an empty string;
  responsive to a determination that the behavioral description of the circuit includes a function call with an unlabeled wait statement, modifying the path annotation to include an empty string; and
  subsequent to processing all of the function calls, removing empty strings from the path annotation.

5. The method of claim 1, wherein the facilitating further includes:
  determining a call point of a function in the behavioral description of the circuit; and
  wherein the defining the path annotation includes, for each function call:
    responsive to a determination that the call point of the function is within an unrolled loop, modifying the path annotation to include an identification of an iteration of the unrolled loop;
    responsive to an identification of a first text, modifying the path annotation to include the first text; and
    responsive to an identification of a wait statement, modifying the path annotation to include a second text associated with the wait statement.

6. The method of claim 1, further comprising:
  generating, by the processor, a report including, for each behavior and each state node: an associated state name, the associated path annotation, and an associated hierarchical path.

7. The method of claim 1, wherein the facilitating further includes:
  receiving a name and the path annotation for the state node;
  responsive to a determination that more than one state node match the received path annotation, creating a unique name for each of the matching state nodes based on the received path annotation and associating each of the created unique names with a respective one of the matching state nodes; and
  responsive to a determination that a unique state node matches the received name, associating the unique state node with the received name;
  wherein each of the created unique names associated with the respective one of the matching state nodes persists through at least two runs of the electronic design and verification tool.

8. The method of claim 7, wherein the facilitating further includes:
  responsive to the determination that more than one state node match the received path annotation, issuing an alert including each of the created unique names and the respective one of the matching state nodes.

9. The method of claim 1, wherein the first text includes a pragma and the second text includes a label.

10. The method of claim 1, wherein the path annotation is based on a string and the defining the path annotation includes modifying the string.

11. An electronic design and verification system for synthesizing a behavioral description of a circuit to generate a structural description of the circuit, the system comprising:

a storage apparatus to store a state node and the behavioral description of the circuit; and
a processor including:
a path annotation component configured to:
parse the behavioral description of the circuit to identify a first text and/or a second text;
define a path annotation based on the identified first text and/or the identified second text; and
annotate the state node with the path annotation; and
an output generator component configured to generate the structural description of the circuit based on the path annotation.

12. The system of claim 11, wherein the path annotation component is further configured to, for each function call of the behavioral description of the circuit:
responsive to an identification of a first text, modify the path annotation to include the first text; and
responsive to an identification of a wait statement, modify the path annotation to include a second text associated with the wait statement.

13. The system of claim 12, wherein the path annotation component is further configured to, for each function call of the behavioral description of the circuit:
responsive to a determination that a first text is unspecified, modify the path annotation to include an empty string;
responsive to a determination that a wait statement is unlabeled, modify the path annotation to include an empty string; and
subsequent to processing all of the function calls, remove empty strings from the path annotation.

14. The system of claim 11, wherein the path annotation component is further configured to:
determine a call point of a function in source code; and
wherein the defining the path annotation includes, for each function call:
responsive to a determination that the call point of the function is within an unrolled loop, modifying the path annotation to include an identification of an iteration of the unrolled loop;
responsive to an identification of a first text, modifying the path annotation to include the first text; and
responsive to an identification of a wait statement, modifying the path annotation to include a second text associated with the wait statement.

15. The system of claim 11, wherein the processor further includes a naming component, the naming component configured to:
receive a name and a path annotation for the state node;
responsive to a determination that more than one state node match the received path annotation, create a unique name for each of the matching state nodes based on the received name and associating each of the created unique names with a respective one of the matching state nodes; and
responsive to a determination that a unique state node matches the received path annotation, associate the unique state node with the received name;
wherein each of the created unique names associated with the respective one of the matching state nodes persists through at least two runs of the electronic design and verification tool.

16. The system of claim 15, wherein in an initial mode of operation:
the processor receives: the behavioral description of the circuit, the name for the state node, and a synthesizing script including instructions for the path annotation component; and
the output generator component outputs: (i) the structural description of the circuit including the name for the state node, and (ii) a naming script for the naming component; and
wherein in a subsequent mode of operation:
the processor receives: the behavioral description of the circuit, the synthesizing script, and the naming script; and
the output generator component outputs: the structural description of the circuit including the name for the state node, the name being the same in the initial mode of operation and the subsequent mode of operation.

17. A non-transitory computer-readable medium storing program instructions that, when executed, cause a processor to execute an electronic design and verification tool for synthesizing a behavioral description of a circuit into a structural description of the circuit, the method comprising:
using a processor:
facilitating generation of the structural description of the circuit by:
parsing the behavioral description to identify a first text and/or a second text;
defining a path annotation based on the identified first text and/or the identified second text; and
annotating a state node with the path annotation; and
generating the structural description of the circuit based on the facilitating.

18. The non-transitory computer-readable medium of claim 17, wherein the defining the path annotation includes, for each function in the source code:
responsive to an identification of a first text, modifying the path annotation to include the first text;
responsive to an identification of a wait statement, modifying the path annotation to include a second text associated with the wait statement;
responsive to a determination that a first text is unspecified, modifying the path annotation to include an empty string;
responsive to a determination that a wait statement is unlabeled, modifying the path annotation to include an empty string; and
subsequent to processing all of the function calls, removing empty strings from the path annotation.

19. The non-transitory computer-readable medium of claim 17, the method further comprising:
determining a call point of a function in the behavioral description of the circuit; and
wherein the defining the path annotation includes, for each function call:
responsive to a determination that a call point of the function is within an unrolled loop, modifying the path annotation to include an identification of an iteration of the unrolled loop;
responsive to an identification of a first text, modifying the path annotation to include the first text; and
responsive to an identification of a wait statement, modifying the path annotation to include a second text associated with the wait statement.

20. The non-transitory computer-readable medium of claim 17, the method further comprising:
receiving a name and the path annotation for the state node;

responsive to a determination that more than one state node match the received path annotation, creating a unique name for each of the matching state nodes based on the received name and associating each of the created unique names with a respective one of the matching state nodes; and responsive to a determination that a unique state node matches the received path annotation, associating the unique state node with the received name;

wherein each of the created unique names associated with the respective one of the matching state nodes persists through at least two runs of the electronic design and verification tool.

\* \* \* \* \*